United States Patent
Sato et al.

(10) Patent No.: US 7,326,309 B2
(45) Date of Patent: Feb. 5, 2008

(54) METHOD OF PRODUCING CERAMIC LAMINATE BODY

(75) Inventors: Kazuhide Sato, Aichi-pref. (JP); Hidekazu Hattori, Nagoya (JP); Toshiaki Kamiya, Yokkaichi (JP); Osamu Inoue, Obu (JP)

(73) Assignee: Denso Corporation, Kariya, Aichi-pref. (JP)

( * ) Notice: Subject to any disclaimer, the term of this patent is extended or adjusted under 35 U.S.C. 154(b) by 0 days.

(21) Appl. No.: 10/119,295

(22) Filed: Apr. 10, 2002

(65) Prior Publication Data

US 2002/0157756 A1    Oct. 31, 2002

(30) Foreign Application Priority Data

Apr. 12, 2001 (JP) .............................. 2001-114278
Feb. 22, 2002 (JP) .............................. 2002-046847

(51) Int. Cl.
*C03B 29/00* (2006.01)
*B32B 37/00* (2006.01)
*H01B 13/00* (2006.01)

(52) U.S. Cl. ................................ 156/89.11; 156/89.12

(58) Field of Classification Search ............ 156/89.11, 156/89.12, 89.14, 153, 154, 250, 256, 264, 156/289; 310/328, 366
See application file for complete search history.

(56) References Cited

U.S. PATENT DOCUMENTS

| 4,347,650 | A | * | 9/1982 | McLarney et al. | ......... 29/25.42 |
|---|---|---|---|---|---|
| 5,169,310 | A | * | 12/1992 | Chance et al. | .............. 432/258 |
| 5,252,883 | A | * | 10/1993 | Kondo | ........................ 310/328 |
| 5,370,760 | A | * | 12/1994 | Mori et al. | ............... 156/89.16 |
| 5,459,371 | A | * | 10/1995 | Okawa et al. | .............. 310/363 |
| 5,468,315 | A | * | 11/1995 | Okada et al. | .................. 156/64 |
| 5,507,896 | A | * | 4/1996 | Yoshimura et al. | ....... 156/89.12 |
| 5,607,535 | A | * | 3/1997 | Tsukada et al. | ............. 156/252 |
| 5,692,280 | A | * | 12/1997 | Taniguchi et al. | ......... 29/25.42 |
| 5,891,281 | A | * | 4/1999 | Giordano et al. | ............. 156/64 |
| 6,077,728 | A | * | 6/2000 | Yamasaki et al. | ........... 438/125 |
| 6,104,598 | A | * | 8/2000 | Duva | ......................... 361/303 |
| 6,190,477 | B1 | * | 2/2001 | Natarajan et al. | ........ 156/89.12 |
| 6,221,193 | B1 | * | 4/2001 | Cassidy et al. | ............. 156/267 |
| 6,242,709 | B1 | * | 6/2001 | Fukuda et al. | ............ 219/69.17 |
| 6,461,940 | B1 | * | 10/2002 | Hasegawa et al. | .......... 438/460 |
| 6,526,958 | B1 | * | 3/2003 | Kubodera et al. | ............ 125/12 |

FOREIGN PATENT DOCUMENTS

GB        2 274 810        *    8/1994

(Continued)

*Primary Examiner*—Melvin Mayes
(74) *Attorney, Agent, or Firm*—Nixon & Vanderhye P.C.

(57) ABSTRACT

This invention provides a method of producing a ceramic laminate body capable of suppressing the occurrence of de-lamination and cracks, and providing high reliability. This method comprises a heat-bonding step of covering a full periphery of side surfaces of ceramic layers 11 positioned in an orthogonal direction to a laminating direction with a side surface jig while the ceramic layers are laminated, heating the ceramic layers and pressing the ceramic layers from both end faces positioned in the laminating direction by end face jigs to form a heat-bonded ceramic laminate body; and a side surface grinding step of grinding or cutting the full periphery of the side surfaces inclusive of damage portions 9 occurring in the ceramic laminate body in the heat-bonding step.

2 Claims, 13 Drawing Sheets

FOREIGN PATENT DOCUMENTS

| | | | |
|---|---|---|---|
| JP | 1-235633 | * | 9/1989 |
| JP | 2-163983 | * | 6/1990 |
| JP | 03-191322 | * | 8/1991 |
| JP | 3-191322 | * | 8/1991 |
| JP | 04-010510 | * | 1/1992 |
| JP | 4-273183 | * | 9/1992 |
| JP | 05-259644 | * | 10/1993 |
| JP | 6-114817 | * | 4/1994 |
| JP | A-6-120579 | | 4/1994 |
| JP | 6-151999 | * | 5/1994 |
| JP | 6-252469 | * | 9/1994 |
| JP | 07-094359 | * | 4/1995 |
| JP | 7-94359 | * | 4/1995 |
| JP | 08-181036 | * | 7/1996 |
| JP | 08-316088 | * | 11/1996 |
| JP | 10-6439 | * | 1/1998 |

* cited by examiner

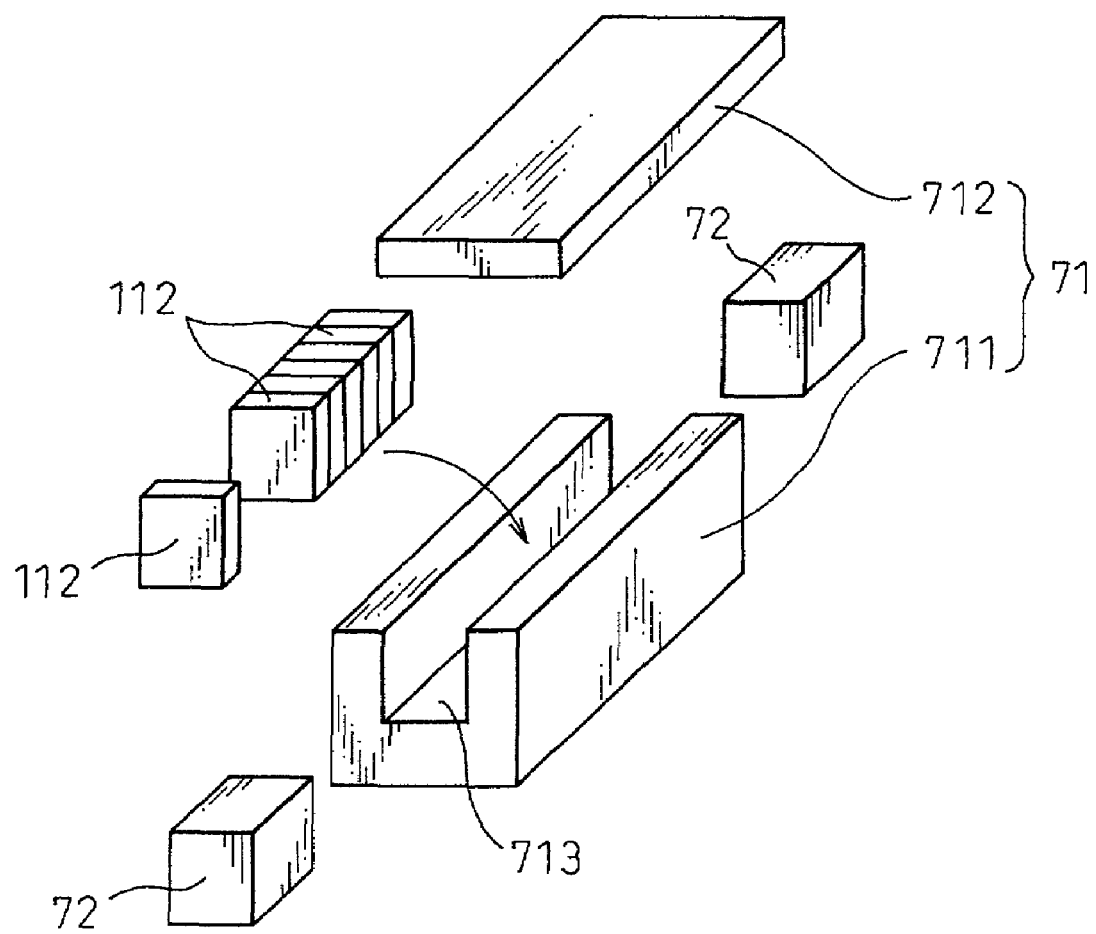

UPPER PORTION

INTERMEDIATE PORTION

LOWER PORTION

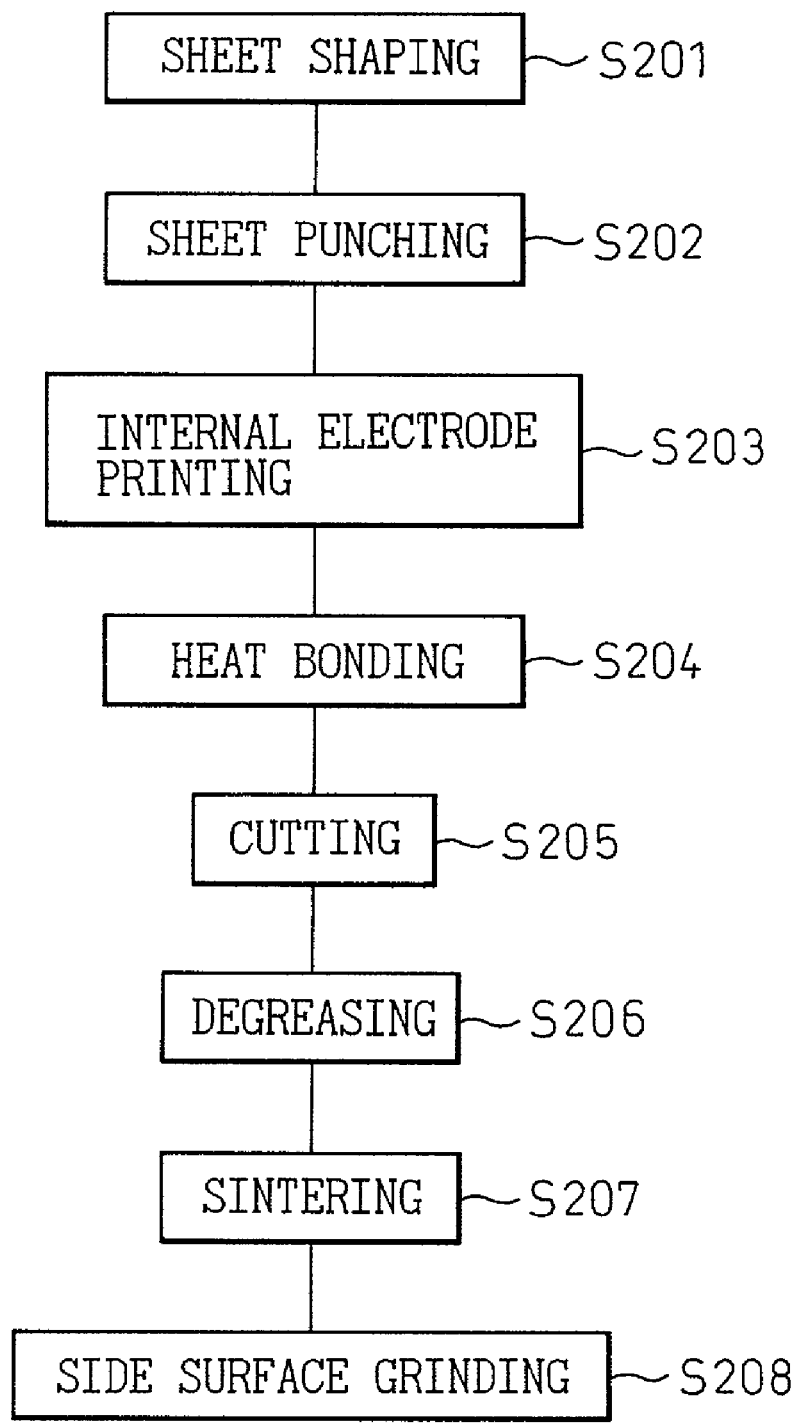

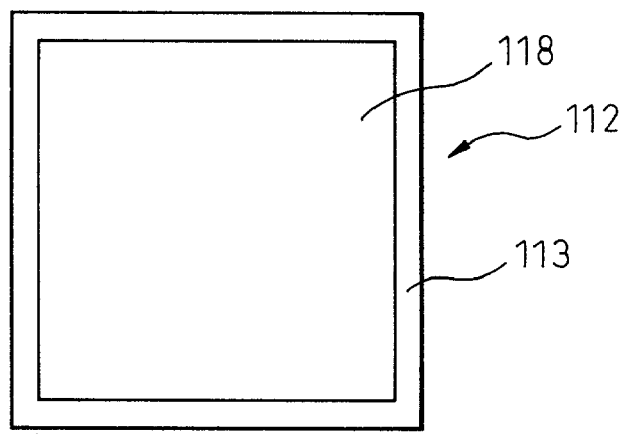
Fig.16(a)
Fig.16(b)
Fig.17
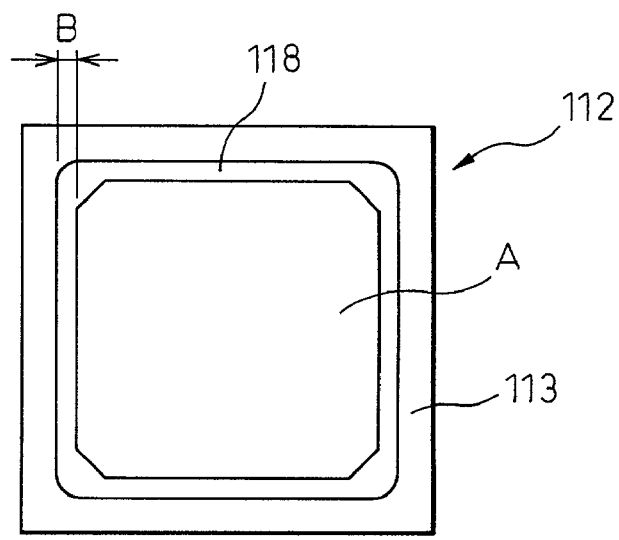

METHOD OF PRODUCING CERAMIC LAMINATE BODY

BACKGROUND OF THE INVENTION

1. Field of the Invention

This invention relates to a method of producing a ceramic laminate body by laminating a plurality of ceramic layers.

2. Description of the Related Art

A ceramic laminate body is used, in some cases, as a high-performance component of a piezoelectric actuator, for example. The piezoelectric actuator uses a ceramic laminate body formed by alternately laminating ceramic layers and internal electrode layers. To acquire high displacement at a low voltage, it has been a recent trend to decrease the thickness of the ceramic layers of the piezoelectric actuator and to increase the number of laminations. To facilitate the assembly of the piezoelectric actuator into an apparatus, its overall size has been reduced.

However, the decrease of the thickness of the ceramic layers and the increase of the number of laminations invite de-lamination (inter-layer peel) and the occurrence of cracks in the resulting ceramic laminate body. These de-laminations and cracks result in an operating defect in the ceramic laminate body.

Such problems similarly occur not only in the piezoelectric actuator but also in other ceramic laminate bodies.

SUMMARY OF THE INVENTION

In view of the problems of the prior art described above, this invention aims at providing a method of producing a ceramic laminate body that can suppress the occurrence of de-lamination and cracks and can provide high reliability.

According to a first aspect of the invention, there is provided a method of producing a ceramic laminate body, by laminating a plurality of ceramic layers, comprising a heat-bonding step of covering a full periphery of side surfaces of the ceramic layers, positioned perpendicular to a laminating direction, with a side surface jig while the ceramic layers are laminated, heating the ceramic layers and pressing the ceramic layers from both end faces positioned in the laminating direction by end face jigs to form a heat-bonded ceramic laminate body; and a side surface grinding step of grinding or cutting the full periphery of the side surfaces inclusive of damaged portions in the ceramic laminate body formed due to the heat-bonding step.

In the heat-bonding step of the invention described above, the ceramic layers laminated by using the side surface jig and the end face jigs are heat-bonded by heating and pressing. At this time, the pressure is applied to the ceramic layers laminated in the laminating direction. At least a part of the ceramic layers slightly moves in the laminating direction due to influences of the addition and removal of the pressing force in the laminating direction and due to the influences of heating and subsequent thermal expansion. Therefore, the ceramic layers undergo deformation on their side surface sides due to the frictional force with the side surface jig, and form damage portions that subsequently result in defects such as de-lamination and cracks.

The invention conducts side surface grinding step after the heat-bonding step as described above. The portion of the ceramic layers inclusive of the damage portions occurring in the heat-bonding step is ground or cut throughout the entire periphery of the side surfaces. Therefore, the invention can prevent the subsequent occurrence of defects resulting from the damage portions such as de-lamination and cracks.

A method of specifying the position of the damage portion includes a method that experimentally observes the deformation condition of the ceramic layers immediately after the heat-bonding step and the subsequent occurrence condition of de-lamination and cracks, and statistically specifies the position of the damage portion. However, when a large number of ceramic laminate bodies are mass-produced, there is a rare case where portions affecting the occurrence of defects develop at positions other than the damage portions. In such a case, too, the invention grinds or cuts the full periphery of the side surfaces and removes the portions other than the damage portions. Therefore the invention can remove the portions affecting the occurrence of defects, and can further improve the defect occurrence prevention effect for de-lamination and cracks.

According to a second aspect of the invention, there is provided a method of producing a ceramic laminate body by laminating a plurality of ceramic layers, comprising a heat-bonding step of covering a full periphery of side surfaces of the ceramic layers positioned perpendicular to a laminating direction with a side surface jig while the ceramic layers are laminated, heating the ceramic layers and pressing the ceramic layers from both end faces positioned in the laminating direction by end face jigs to form a heat-bonded ceramic laminate body, wherein a friction reducing material for reducing friction between the side surface jig and the ceramic layers is, in advance, applied to an inner surface the said side surface jig.

In the invention, the friction reducing material is, in advance, applied to the inner surface of the side surface jig. Therefore, even when the ceramic layers move in the laminating direction in the heat-bonding step, the friction reducing material can reduce the frictional force between the side surfaces of the ceramic layers and the side surface jig. In consequence, deformation of the ceramic layers during the heat-bonding step can be suppressed, and the subsequent occurrence of the damaged portions resulting in defects such as de-lamination and cracks can be prevented.

Therefore, this invention, too, can provide a method of producing a ceramic laminate body free from defects such as de-lamination and cracks and having high reliability.

According to a third aspect of the invention, there is provided a method of producing a ceramic laminate body by laminating a plurality of ceramic layers, comprising a heat-bonding step of covering a full periphery of side surfaces of the ceramic layers positioned perpendicular to a laminating direction with a side surface jig while the ceramic layers are laminated, heating the ceramic layers and pressing the ceramic layers from both end faces positioned in the laminating direction by end face jigs to form a heat-bonded ceramic laminate body; and cooling the ceramic laminate body to a temperature lower than a glass transition point of a binder resin contained in the ceramic layers, and then releasing the pressure from the side surface jig and the end face jig to the ceramic laminate body.

In this invention, the ceramic laminate body is cooled to a temperature lower than the specific temperature described above after the heat-bonding step, and the pressure applied to the ceramic laminate body is then removed. In other words, the pressure is kept applied to the ceramic laminate body until the ceramic laminate body is cooled to the specific temperature or below.

Therefore, after heating and pressing necessary for heat-bonding are completed, the deformation amount of the ceramic laminate body at the removal of the pressing force can be reduced. As a result, deformation of the ceramic layers due to the friction of their side surfaces with the side surface jig can be decreased, and the occurrence of the damage portion itself can be suppressed.

Therefore, this invention, too, can provide a production method of a ceramic laminate body free from defects such as de-lamination and cracks and having high reliability.

According to a fourth aspect of the invention, there is provided a method of producing a ceramic laminate body by laminating a plurality of ceramic layers, comprising a heat-bonding step of covering a full periphery of side surfaces of the ceramic layers positioned perpendicular to a laminating direction with a side surface jig while the ceramic layers are laminated, heating the ceramic layers and pressing the ceramic layers from both end faces positioned in the laminating direction by end face jigs to form a heat-bonded ceramic laminate body; and removing the pressure from the end face jigs to the ceramic laminate body at a rate of not higher than 1,000 MPa/sec.

In this invention, the rate for removing the pressure to the ceramic laminate body after the heat-bonding step is carried out at a low rate of 1,000 MPa/sec or below. In this case, displacement of the ceramic laminate body occurring at the removal of the pressure after the heat-bonding step becomes slow, and drastic displacement can be suppressed. Consequently, deformation resulting from the friction between the side surfaces of the ceramic layers and the side surface jig can be reduced, and the occurrence of the damage portion itself can be suppressed.

Therefore, this invention, too, can provide a method of producing a ceramic laminate body free from defects such as de-lamination and cracks and having high reliability.

Incidentally, the lower the pressure removing rate described above, the better. From the aspect of productivity, however, the minimum rate is preferably 10 MPa/sec.

According to a fifth aspect of the invention, there is provided a production method of a ceramic laminate body by laminating a plurality of ceramic layers, comprising a heat-bonding step of covering a full periphery of side surfaces of the ceramic layers positioned perpendicular to a laminating direction with a side surface jig while the ceramic layers are laminated, heating the ceramic layers and pressing the ceramic layers from both end faces positioned in the laminating direction by end face jigs to form a heat-bonded ceramic laminate body; and removing the pressure from the side surface jig and separating the side surface jig from the ceramic laminate body before the pressure from the end face jigs is removed when the pressure from the side surface jig and from the end face jigs to the ceramic laminate body is removed.

In this invention, when the pressure to the ceramic laminate body is removed after the heat-bonding step, the side surface jig is first separated to release the side surface side of the ceramic laminate body while the pressure from the end face jigs is maintained. The pressure from the end face jigs is then removed. Therefore, even when the ceramic laminate body undergoes displacement in the laminating direction at the removal of the pressure from the end face jigs, the frictional force is not imparted to the side surfaces of the ceramic layer. Therefore, deformation resulting from the friction between the side surfaces of the ceramic layers and the side surface jig can be prevented, and the occurrence of the damage portion itself can be suppressed.

Therefore, this invention, too, can provide a production method of a ceramic laminate body free from defects such as de-lamination and cracks and having high reliability.

According to a sixth aspect of the invention, there is provided a production method of a ceramic laminate body by laminating a plurality of ceramic layers, comprising a heat-bonding step of heating a plurality of ceramic sheets and pressing them in a laminating direction while they are laminated, to form a heat-bonded broad intermediate laminate body; a cutting step of pushing a cutting edge having an edge of an acute angle from one of the surfaces of the broad intermediate laminate body for cutting to form units; and a side surface grinding step of grinding or cutting side surfaces of the units inclusive of a cut surface formed by the cutting step.

In the production method of this invention, the broad intermediate laminate body is first formed in the heat-bonding step as described above. In the next cutting step, the cutting edge having the structure described above is used to cut the laminate body to form the units. In other words, so-called "push-cutting" is carried out to fragment the laminate body into the units. Therefore, the cutting step can be carried out extremely efficiently.

On the other hand, each unit receives a certain kind of damage on the cut surface by the influences of the edge having the acute angle. More concretely, the compression amount to the section changes in accordance with the thickness of the cutting edge. Therefore, the density in the proximity of the cut surfaces changes in the cutting direction. The resulting ceramic laminate body under this state is likely to invite defects such as deformation, de-lamination and cracks due to this density difference.

This invention conducts the side surface grinding step as a post-step to the cutting step. The portion receiving the damage (damage portion) remaining on the cut surface of each unit is removed. Therefore, the cutting step using the cutting edge can be efficiently carried out and the occurrence of defects in the resulting ceramic laminate body can be drastically suppressed.

Incidentally, the side surface grinding step described above may be carried out immediately after the cutting step and then the sintering step of the units may be carried out. Alternatively, the side surface grinding step can be carried out after the sintering step of the unit.

The final ceramic laminate body can be obtained by laminating a plurality of units, or by using only one unit.

BRIEF DESCRIPTION OF THE DRAWINGS

FIG. 3 is an explanatory view showing jigs used in a heat-bonding step in Example 1;

FIG. 13 is a block diagram showing production steps in Example 6;

FIGS. 16(a) and 16(b) show units immediately after the cutting step in Example 6, wherein FIG. 16(a) is a plan view and FIG. 16(b) is a side view;

FIG. 17 is an explanatory view showing a region to be ground in a side surface grinding step (a region to be left after grinding) in Example 6;

DESCRIPTION OF THE PREFERRED EMBODIMENTS

Figure 1:
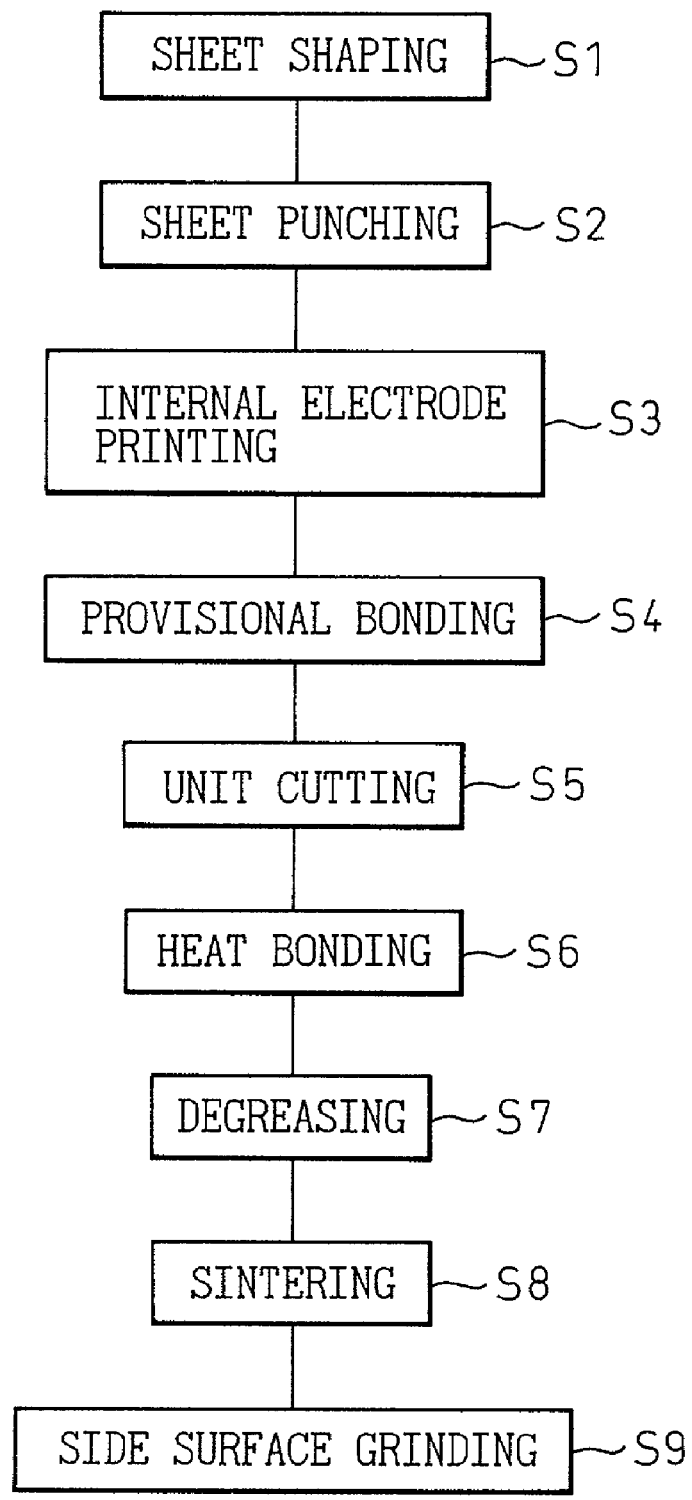
FIG. 1 is a block diagram showing production steps in Example 1.

In the first invention described above, the damaged portion may be the inflection point at which a warping direction in the direction of thickness of the ceramic layers changes, and a portion outside the inflection point. In other words, it has been experimentally confirmed that in the heat-bonding step described above, the ceramic laminate body undergoes displacement in a shrinking direction in the laminating direction due to heating and pressing, and after pressing is subsequently removed, the ceramic laminate body undergoes displacement in an expanding direction in the laminating direction. Therefore, the deformation condition of the ceramic layers constituting the ceramic laminate body sometimes invites warps in different directions with an inflection point due to the occurrence of two-stage displacement described above. In this case, the portion outside the inflection point is finally likely to invite defects such as delamination and cracks. Therefore, this range can be regarded as the damage portion described above.

The ceramic layer described above is formed of piezoelectric ceramic, and at least a part of the ceramic laminate body is constituted by alternately laminating the ceramic layers and the internal electrode layers. The number of lamination of the ceramic layers is preferably at least 50 layers. In this case, de-lamination and cracks are likely to occur, and the function and effect of the first invention is particularly effective.

The ceramic laminate body has a square pole shape when the heat-bonding step described above is carried out, and is preferably shaped into a circular cylindrical shape, a barrel-like shape or an octagonal shape in the side surface grinding step described above. The damage portion is likely to develop at the corner portion during the heat-bonding step of the ceramic laminate body particularly when the ceramic laminate body has the square pole shape. In this case, when the ceramic laminate body is shaped into the circular cylindrical shape or the barrel-like shape or the octagonal shape, the corner portions of the square can be drastically removed, and the damage portions by the side surface grinding step can be easily removed.

Both ceramic layer and internal electrode layer substantially have a polygonal shape. The ceramic laminate body has portions where the internal electrode layer exists between the ceramic layers adjacent in the laminating direction and the reserve portion, where the internal electrode layer does not exist, on at least one of the surrounding sides of the former. When the side surface having the reserve portion is ground or cut in the side surface grinding step described above, grinding or cutting is preferably conducted substantially in parallel with the boundary line between the reserve portion and the internal electrode layer.

When the ceramic laminate body has the reserve portion, the damage portion described above is likely to develop in parallel with the boundary line between the reserve portion and the internal electrode layer. In this case, the damage portion can be removed by conducting grinding or cutting in parallel with the boundary line as described above.

To conduct the side surface grinding step described above, it is preferred to first grind or cut the side surface other than the side surface having the reserve portion in such a manner as to expose the internal electrode layer to the side surface, and then to grind or cut the side surface having the reserve portion. In this case, the side surface not having the reserve portion is first ground or cut to expose the internal electrode layer. In consequence, the position of the reserve portion becomes clear. Therefore, the cutting margin for grinding or cutting the side surface having the reserve portion can be set easily and accurately, and the damage portion at the reserve portion can be more reliably removed.

A sintering step of sintering the ceramic laminate body is preferably carried out between the heat-bonding step and the side surface grinding step. As the sintering step is carried out, the hardness of the ceramic laminate body is improved and grinding or cutting becomes easy. Therefore, when the sintering step is conducted before the side surface grinding step, accuracy of grinding or cutting in the side surface grinding can be improved.

It is of course possible to conduct the side surface grinding step immediately after the heat-bonding step described above and then to conduct the sintering step.

To reduce the grinding margin and to shorten the grinding time, the laminate body may be cut or segmented for shaping after heat-bonding and before grinding.

To conduct the sintering step, the ceramic laminate body is held at 1,100° C. for 2 hours, for example.

In the second invention, too, the ceramic layer is formed of piezoelectric ceramic, the ceramic laminate body is constituted by alternately laminating the ceramic layers and the internal electrode layers, and the number of lamination of the ceramic layers is preferably at least 50 layers. In this case, since de-lamination and cracks are likely to develop as described above, the function and effect of the second invention is particularly effective.

The friction reducing material described above preferably contains at least one kind of the members of the group consisting of a silicone resin, silicone oil, a fluorocarbon resin, fluorine type oil, a paraffin resin, a paraffin type resin and boron nitride powder. When the friction reducing agent contains these resins or oil, it can easily provide a lubrication effect between the side surface jig and the ceramic laminate body in the heat-bonding step.

In each of the inventions described above, the ceramic laminate body is a piezoelectric device used for an injector and has an aspect ratio A/B of at least 2 where A is a size in the laminating direction and B is a width. Here, the aspect ratio is a ratio of the length in the laminating direction to the width in the transverse direction crossing the former as described above. The aspect ratio (A/B) of at least 2 represents that the length (size in the laminating direction) is at least twice the width (in the transverse direction).

The piezoelectric device used for the injector must undergo displacement at an extremely high speed and with a high level of accuracy, and is used under severe conditions. If delamination and cracks develop, they are fatal to the piezoelectric device. Particularly when the aspect ratio described above is 2 or more, the displacement quantity as the piezoelectric device can be increased but delamination and cracks are likely to develop. Therefore, the function and effect of each of the inventions described above is effective.

In the sixth invention, a sintering step for sintering the unit is preferably carried out between the heat-bonding step and the side surface grinding step. In this case, grinding or cutting in the side surface grinding step can be carried out accurately.

A bonding step of laminating a plurality of units by using an adhesive is preferably carried out after the side surface grinding step. In this case, the production method described above is employed to produce a plurality of units in which the damage portion at the time of cutting does not remain, and the units are then laminated. Therefore, the ceramic laminate body having a relatively large size in the laminating direction can be fabricated without the occurrence of defects of the damage portion resulting from cutting.

The unit immediately after the cutting step described above has a square pole shape, and the side surface cutting step preferably shapes the unit into the circular cylindrical shape, the barrel-like shape or the octagonal shape. In this case, since the unit has the circular cylindrical shape or the barrel-like shape or the octagonal shape, the corner portions of the square immediately after the cutting step can be greatly removed. In this way, the corner portions of the square at which the damage is likely to develop during cutting can be reliably removed.

Preferably, the ceramic layer is formed of piezoelectric ceramic, at least a part of each unit is constituted by alternately laminating the ceramic layers and the internal electrode layers and the number of lamination of the ceramic layers is two or more layers. In this case, since defects are likely to develop due to the influence of the damage portion resulting from cutting in the cutting step, the function and effect of the production method described above is effectively exhibited.

Preferably, both the ceramic layer and the internal electrode layer substantially have a polygonal shape, the ceramic laminate body has portions, where the internal electrode layer exists, between the ceramic layers adjacent in the laminating direction and the reserve portion, where the internal electrode layer does not exist, on at least one of the surrounding sides of the former, and when the side surface having the reserve portion is ground or cut in the side surface grinding step, grinding or cutting is conducted substantially in parallel with the boundary line between the reserve portion and the internal electrode layer.

In this case, when a certain kind of damage portion occurs due to the existence of the reserve portion, the damage portion can be easily removed, and a ceramic laminate body having higher quality can be acquired.

Preferably, the ceramic laminate body comprises one unit or a laminate of a plurality of units, and is a piezoelectric device used for an injector.

The piezoelectric device used for the injector must undergo displacement at an extremely high speed and with a high level of accuracy and is used under a severe condition as described already. Therefore, if de-lamination and cracks occur, they are fatal to the piezoelectric device. The ceramic laminate body according to the fifth invention described above comprises the excellent unit described above as the basic structure, can therefore suppress the occurrence of de-lamination and cracks, and can be effectively used as the piezoelectric device for the injector.

EXAMPLE 1

The invention will be explained using the working examples thereof shown in FIGS. 1 to 12.

Figure 12:
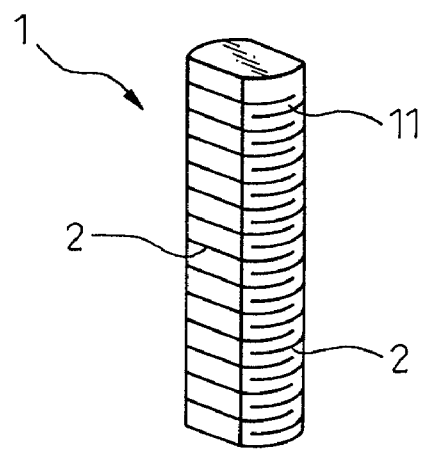
FIG. 12 is a perspective view showing a ceramic laminate body having a barrel-like sectional shape in Example 1.
Figure 14A:
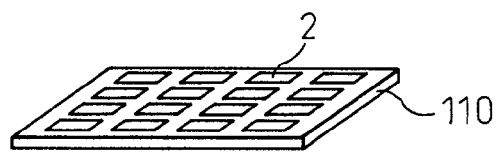
FIGS. 14(a) to 14(d) are explanatory views showing the production steps in Example 6.
Figure 14B:
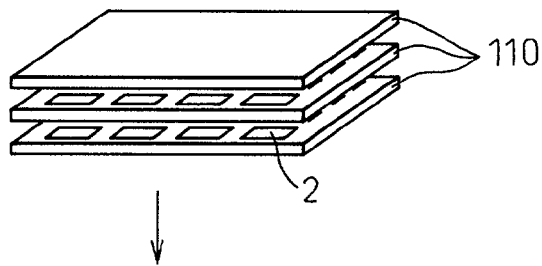
Figure 14C:
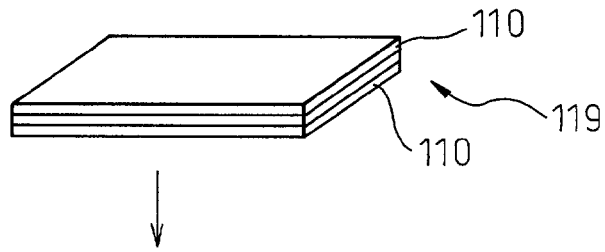
Figure 14D:

This example relates to a method of producing a ceramic laminate body 1 by laminating a plurality of ceramic layers 11 as shown in FIG. 12. In this example, in particular, the ceramic layer 11 is formed of piezoelectric ceramic, and the ceramic laminate body 1 is constituted by alternately laminating the ceramic layers 11 and internal electrode layers 2. The number of lamination of the ceramic layers 11 is 50 layers or more.

To produce the ceramic laminate body 1, this example uses a production method including a heat-bonding step S6 and a side surface grinding step S9 as will be described later.

The heat-bonding step S6 is carried out in the following way. While the ceramic layers 11 are laminated, a side surface jig 71 covers the full periphery of the side surfaces of the ceramic layers 11 positioned in the orthogonal direction to the laminating direction. While the ceramic layers 11 are heated, end face jigs 72 press them from both of their end faces positioned in the laminating direction to form the heat-bonded ceramic laminate body.

The side surface grinding step S9 is the one that grinds or cuts the entire periphery of the side surfaces inclusive of a damage portion 9 occurring, in the ceramic laminate body 1, in the heat-bonding step.

Next, an explanation will be given in detail.

To produce the ceramic laminate body 1, this example conducts a sheet shaping step S1 for shaping an elongated ceramic sheet as the basis of the ceramic layer 11 and a sheet punching step S2 for punching out the ceramic sheet 110 (FIG. 2) having a predetermined size from the elongated ceramic sheet as shown in FIG. 1.

The sheet shaping step S1 can use various methods such as a doctor blade method, an extrusion molding method and so forth. This example prepares an elongated ceramic sheet wound into a roll by the doctor blade method. The starting material used in this case is adjusted so as to obtain a desired piezoelectric ceramic after sintering. Though various starting materials can be used, this example concretely uses PZT (lead zircotitanate).

In the sheet-punching step S2, the ceramic sheet 110 capable of providing sixteen ceramic layers 11 is cut out from the elongated ceramic sheet described above.

Figure 2A:
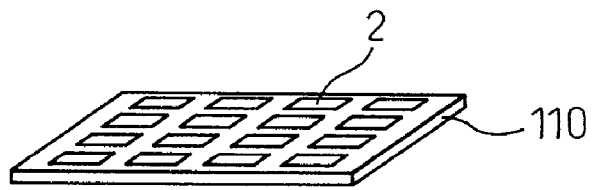
FIGS. 2(a) to 2(f) are an explanatory views showing the production steps in Example 1.
Figure 5:
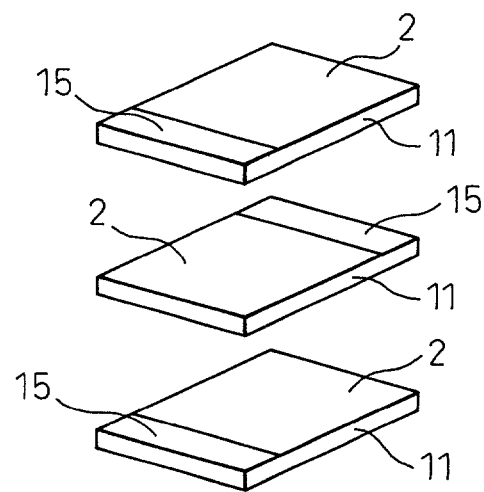
FIG. 5 is an exploded explanatory view showing a lamination condition of ceramic layers in Example 1.

Next, an internal electrode printing step S3 is carried out as shown in FIGS. 1 and 2(a). In this step, the internal electrode layer 2 is pattern-printed onto each ceramic sheet 110. At this time, the printing position of the internal electrode layer 2 is set so that a reserve portion 15 can eventually be formed on the ceramic layer 11 (FIG. 5).

Figure 2B:
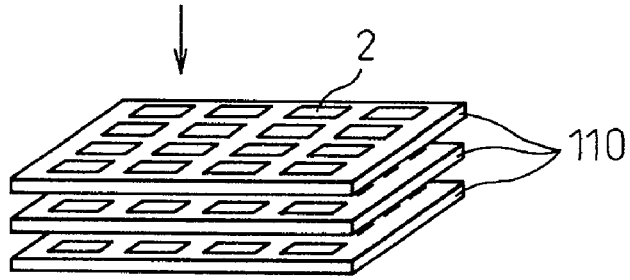
Figure 2C:
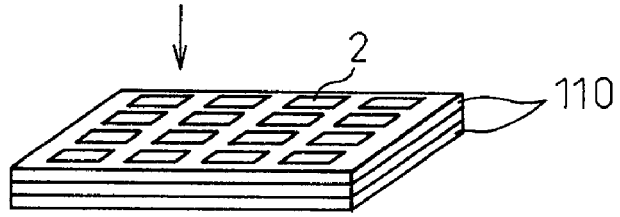

Next, a provisional bonding step S4 is carried out as shown in FIGS. 1, 2(b) and 2(c). In this provisional bonding step S4, ten ceramic sheets 110 each having the internal electrode layer 2 printed thereon are laminated and heat-bonded. Incidentally, FIGS. 2(a) to 2(f) show the ceramic sheets 110 by simplifying the number of laminations, etc. The heat-bonding condition at this time uses a lower temperature and a lower pressure than the later-appearing heat-bonding step S6. More concretely, the heating temperature is 80° C. and the pressure is 5 MPa. Jigs (not shown) clamp and press, from above and below, the ceramic sheets for 3 minutes.

Figure 2D:
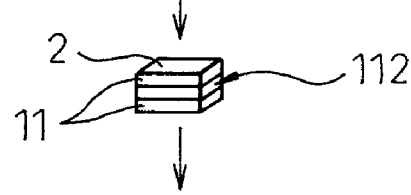
Figure 2E:
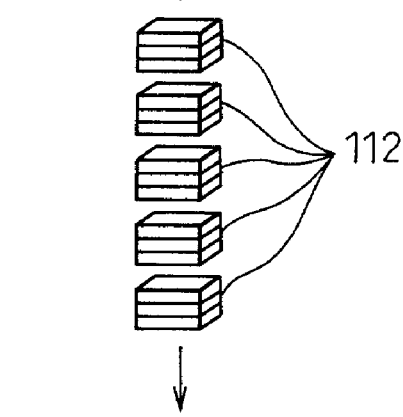

Next, a unit cutting step S5 is carried out as shown in FIGS. 1 and 2(d). This unit cutting step S5 cuts the ceramic sheets 110 of ten laminates into the size of each ceramic layer 11. In this way, there are obtained sixteen units 112 each comprising ten ceramic layers provisionally bonded from the ceramic sheet 110 after provisional bonding.

Next, twenty units 112 are laminated to conduct a heat-bonding step S6 as shown in FIGS. 1, 2(e), 2(f), 3 and 4.

More concretely this step S6 uses a first side surface jig 711 having a ⊃-shaped section (a lying U-section) and a second side surface jig 712 to be put on the first side surface jig 711 as a side surface jig 71 as shown in FIG. 3. An end face jig 72 uses a pair of jigs capable of being fitted into a recess 713 of the first side surface jig 711.

While twenty units 112 are laminated as shown in FIG. 3, the end face jigs 72 are fitted into the recess 713 of the first side surface jig 711. Next, the second side surface jig 712 is put on the first side surface jig 712. Under this condition, the end face jigs 72 are fitted from both ends of the side surface jig 71 into the recess 713 of the first side surface jig 711 to carry out the heat-bonding step.

Since heating is conducted before pressing in this example, the jigs and the ceramic laminate body are left standing in a thermostat at 120° C. for 30 minutes. Thereafter, the assembly is transferred to a press machine and is pressed.

In this example, the pressing force from the end face jig 72 in the laminating direction is 34 MPa. The pressing time is 3 minutes. The temperature of the press machine is kept at 120° C. to prevent the laminate body being cooled during pressing.

The heating temperature can be changed within the range of 80 to 250° C. The pressing force can be changed within the range of 5 to 100 MPa. The time for pressing and heating can be changed in accordance with the size of the ceramic layers 11 and the number of their lamination.

Figure 2F:
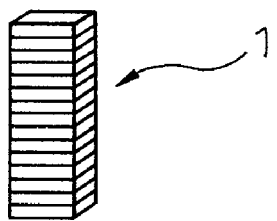
Figure 4:
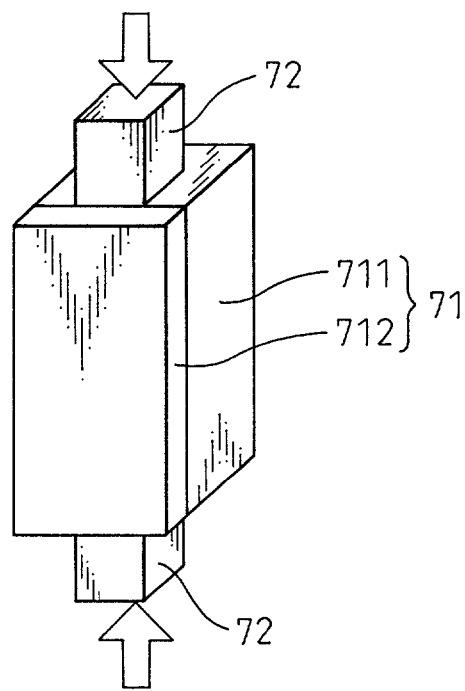
FIG. 4 is an explanatory view showing a condition where the heat-bonding step is carried out in Example 1.

In this example, heating and pressing are carried out for a predetermined time in the heat-bonding step S6, and cooling is then done. The end face jig 72 is removed and the side surface jig 71 is disassembled. As a result, the ceramic laminate body 1 having the square pole shape can be obtained as shown in FIG. 2(f).

FIG. 5 is an exploded view of this ceramic laminate body 1. As shown in the drawing, each of the ceramic layers 11 and the internal electrode layers 2 together constituting the ceramic laminate body 1 has a rectangular shape. The ceramic laminate body 1 includes the reserve portions 15, on which the internal electrode layer 2 does not exist, between the adjacent ceramic layers 11 and alternately on the two side surface sides opposing each other.

Figure 6A:
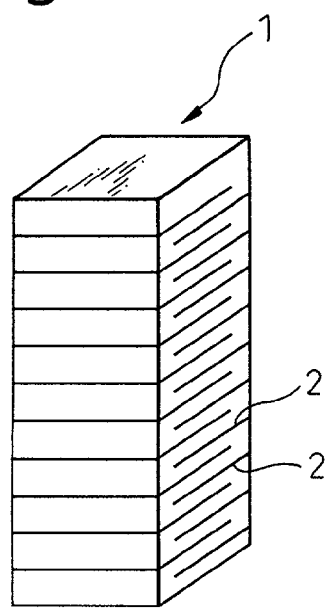
FIGS. 6(a) to 6(d) are explanatory views showing a deformation condition of the ceramic laminate body immediately after the heat-bonding step in Example 1.
Figure 6B:
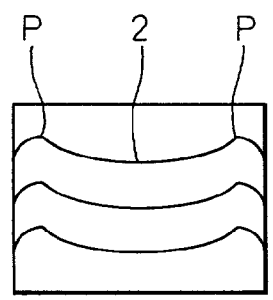
Figure 6C:
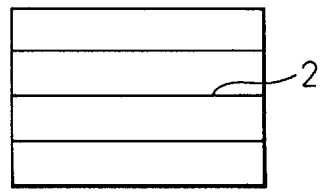
Figure 6D:
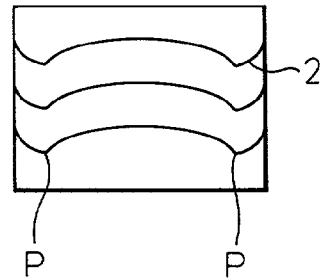

Next, in this example, the deformation condition of each ceramic layer 11 in the ceramic laminate body 1 immediately after the heat-bonding step S6 is examined. FIGS. 6(a) to 6(d) show the result. As shown in FIG. 6(a), the lamination condition of each of the upper, intermediate and lower layers is observed while the ceramic laminate body 1 is kept upright. The result is shown in FIGS. 6(b) to 6(d).

As shown in FIG. 6(b), the upper ceramic layers 11 gradually warp upward towards the end portions at the center portion and gradually warp downward from the inflection point P, on the contrary. As shown in FIG. 6(d), the lower ceramic layers 11 gradually warp downward towards the end portions at the center portion and warp upward from the inflection point P, quite contrary to the upper ceramic layers. As shown in FIG. 6(c), the ceramic layers at the center hardly exhibit any deformation.

The experiments conducted so far reveal that the outer portion from the inflection point P in the upper and lower portions can be the damage portion 9 at which de-lamination and cracks are likely to occur when the ceramic laminate body 1 is used as the piezoelectric device. In the ceramic laminate body 1 of this example, the portions surrounding the barrel-like portion are judged as the damage portion 9. In other words, the portions outside the portion surrounded by the arc profile at the corners of the square pole and the portions outside the portion surrounded by the profile parallel to the boundary line between the reserve portion 15 and the internal electrode layer 2 on the side surface, where the reserve portion 15 exists, are the damage portion 9.

To remove the damage portion 9, the following two steps are carried out, followed then by the side surface grinding step S9.

A degreasing step S7 and a sintering step S8 are carried out for the ceramic laminate body 1 before the side surface grinding step S9 as shown in FIG. 1. The degreasing step S7 is carried out at 350° C. for 5 hours. The sintering step S8 is carried out at 1,100° C. for 2 hours.

In this example, the units are formed as the intermediate body to achieve the final number of lamination of 50 or more layers, for example. However, it is also possible to directly laminate one by one the ceramic layers 11 each having the internal electrode layer printed thereon to the final number of lamination and to heat-bond them together. In this case, too, the damage portion 9 occurs in the same way as described above. In this example, grinding is carried out after sintering, but the similar effect can be obtained when the damage portion is ground off after heat-bonding (before degreasing and sintering), too. The same problem of the damage portion 9 occurs in other lamination methods so long as heat-bonding is carried out in the same way as described above. Therefore, the following process steps are effective in all cases when the damage portion 9 occurs.

Next, the side surface grinding step S9 is carried out as shown in FIG. 1.

Figure 9:
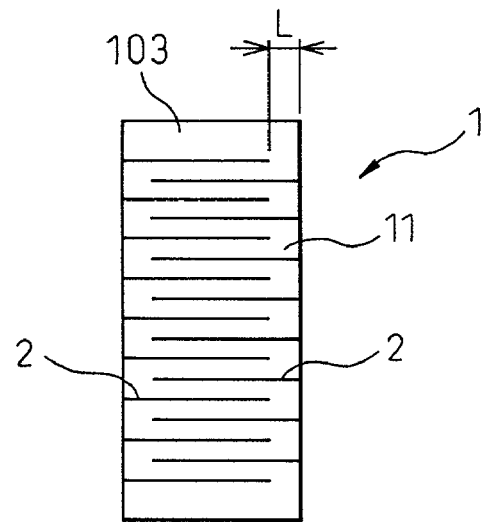
FIG. 9 is an explanatory view showing a length of a reserve portion in Example 1.

In this example, the side surfaces 103 and 104 other than the side surfaces 101 and 102 having the reserve portion 15 are first ground flat by using a grinding wheel 5 as a provisional grinding step in such a manner as to expose the internal electrode layer 2 to the side surfaces 103 and 104. As a result, the length L of the reserve portion 15 can be correctly grasped from the side surfaces 103 and 104 as shown in FIG. 9.

Figure 10:
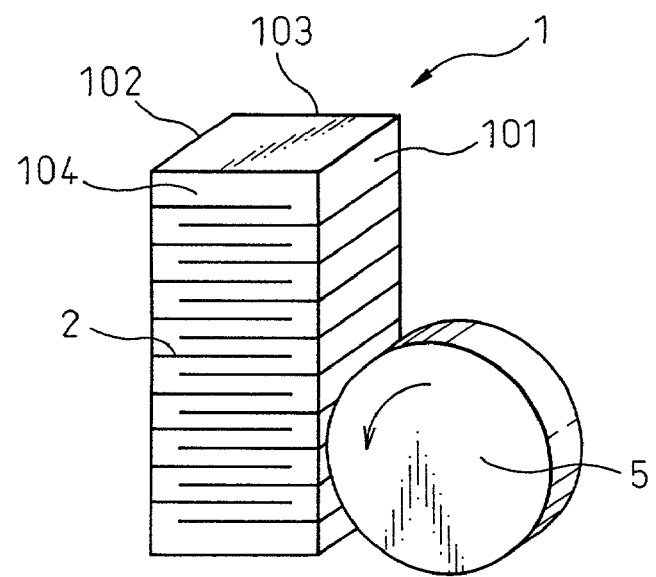
FIG. 10 is an explanatory view showing a condition where a side surface having the reserve portion is ground in Example 1.

Next, as shown in FIG. 10, the side surfaces 101 and 102 having the reserve portion 15 are ground by using the grinding wheel 5. At this time, grinding is conducted in parallel with the boundary line between the reserve portion 15 and the internal electrode layer 2.

Figure 11:
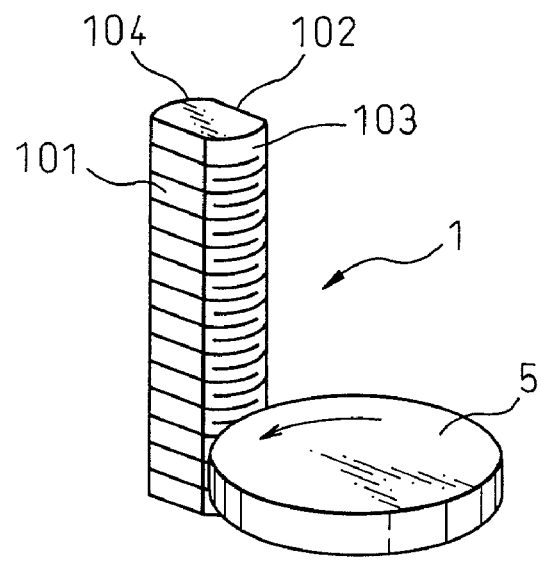
FIG. 11 is an explanatory view showing a condition where a side surface not having the reserve portion is ground into an arc shape in Example 1.

The side surfaces 103 and 104 are then ground to an arc shape by using the grinding wheel 5 as shown in FIG. 11. In consequence, the ceramic laminate body 1 having a barrel-like sectional shape can be obtained as shown in FIG. 12.

Figure 7:
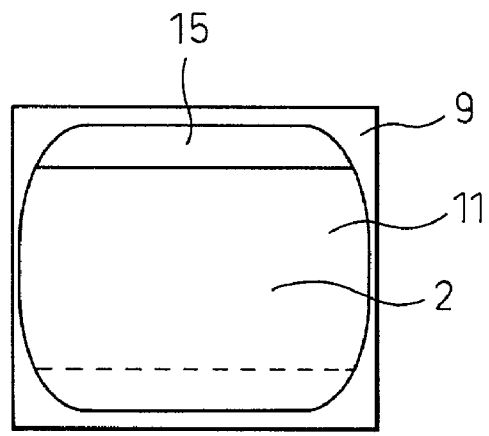
FIG. 7 is an explanatory view showing a damage portion in Example 1.
Figure 8:
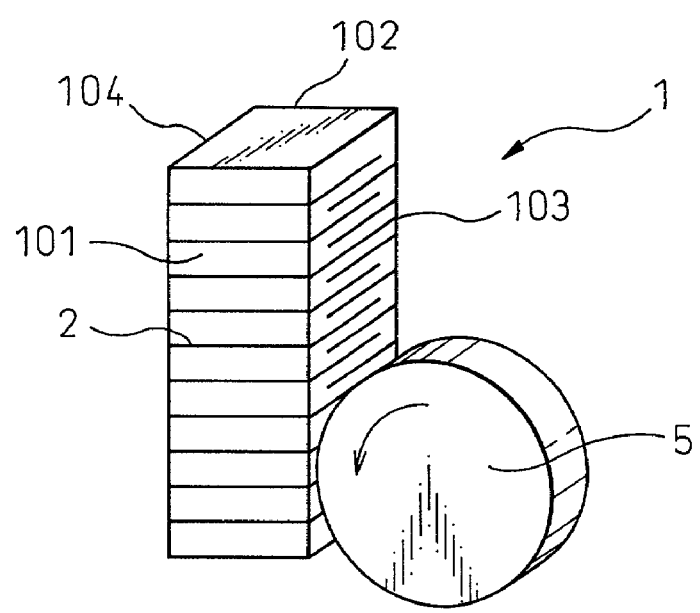
FIG. 8 is an explanatory view showing a condition where a provisional grinding step is carried out in Example 1.

The region removed in this side surface grinding step S9 is the greatest at the corners of the square as shown in FIG. 7, followed then by the portions of the side surfaces 101 and 102 having the reserved portion.

When a post-step of disposing side surface electrodes is additionally carried out, this ceramic laminate body 1 can be converted to a piezoelectric device.

Next, the function and effect of this example will be explained.

In this example, the side surface grinding step S9 is conducted after the heat-bonding step S6 in the production process as described above. The damage portion 9 is sufficiently ground. Therefore, the subsequent occurrence de-lamination and cracks resulting from the damage portion can be prevented.

In this example, in particular, the number of lamination of the ceramic layers 11 in the ceramic laminate body 1 is 50 or more, and the ceramic laminate body 1 is used as the piezoelectric device. Therefore, de-lamination and cracks are extremely likely to occur in the case of conventional ceramic laminate bodies. Because the damage portion 9 is removed in the side surface grinding step S9, however, this example can suppress the occurrence of de-lamination and cracks.

In this example, further, the ceramic laminate body 1 has the square pole shape when the heat-bonding step S6 is carried out, and is changed to the barrel-like shape when the side surface grinding step S9 is carried out. Therefore, the damage portions 9 at the corners having a relatively large area inclusive of the inflection point P can be reliably removed. Because grinding of the barrel-like shape is conducted, the damage portion occurring in the reserve portion 15 can be sufficiently removed as grinding is done parallel to the boundary line between the reserve portion 15 and the internal electrode layer 2.

When the side surface grinding step S9 is carried out in this example, the side surfaces 103 and 104 other than the side surfaces 101 and 102 having the reserve portion 15 are first ground so as to expose the internal electrode layer 2 to each side surface 103, 104. Therefore, the grinding margin of the side surfaces 101 and 102 having the reserve portion 15 can be determined easily and correctly and by so doing, the damage portion can be more reliably removed.

In this example, the degreasing step S7 and the sintering step S8 of the ceramic laminate body 1 are carried out between the heat-bonding step S6 and the side surface grinding step S9. Therefore, the hardness of the ceramic laminate body 1 can be improved, and grinding can be conducted easily and precisely.

When such a side surface grinding step S9 having high accuracy is carried out, the occurrence of de-lamination and cracks can be sufficiently suppressed.

EXAMPLE 2

This example uses, as such, the production steps of Example 1. However, a friction reducing material is applied in advance to the inner surface of the side surface jig 71 used in the heat-bonding step S6, that is, to the recess 713 of the first side surface jig 711 and to the inner surface of the second side surface jig 712. This example uses silicone oil as the friction reducing material.

The rest of the steps are the same as those of Example 1.

In this example, even when the ceramic layer 11 moves in the laminating direction in the heat-bonding step S6, the friction reducing material can reduce the frictional force between the side surface of the ceramic layer 11 and the side surface jig 71. Therefore, this example can suppress deformation of the ceramic layer 11 during the heat-bonding step and can prevent the occurrence of a damaged portion that may otherwise result in the defects such as de-lamination and cracks. In other words, this example can further reliably prevent the occurrence of de-lamination and cracks.

This example can obtain a similar function and effect to that of Example 1.

EXAMPLE 3

This Example uses, as such, the production steps of Example 1 but changes the pressure removing sequence after the heat-bonding step S6 is conducted. Incidentally, in Example 1, after pressing is completed, pressing is immediately stopped.

In this example, the ceramic laminate body 1 is cooled down to a temperature below a glass transition point of the binder resin contained in the ceramic layer, and then the pressure from the end face jig 72 to the ceramic laminate body 1 is removed. More concretely, the pressure is kept applied from the heating temperature of 120° C. in the heat-bonding step S6 to the glass transition point 75° C. After the temperature falls below 75° C., the pressure from the end face jig 72 is quickly removed and the jig is disassembled.

The rest of the steps are the same as those of Example 1.

In this example, the deformation amount of the ceramic laminate body 1 can be reduced at the time of the removal of the pressing force after heating and pressing necessary for heat-bonding are completed. In consequence, deformation resulting from the friction between the side surface of the ceramic layer 11 and the side surface jig 71 can be reduced and the occurrence of the damage portion itself can be suppressed. It is therefore possible to more reliably prevent the occurrence of de-lamination and cracks.

This example can provide a similar function and effect to that of Example 1.

EXAMPLE 4

This example uses, as such, the production steps of Example 1 but changes the pressure removing rate of removing the pressure from the end face jig 72 to the ceramic laminate body 1 to 1000 MPa/sec or below after the heat-bonding step S6 is carried out. Speaking concretely, this example sets the pressure removing rate to 17 MPa/sec. In other words, after the heat-bonding step S6 is carried out by imparting the pressing force of 34 MPa from the end face jig 72, this pressing force is removed in a period of two seconds.

The rest are the same as those of Example 1.

In this case, displacement of the ceramic laminate body 1 occurring at the removal of the pressure after the heat-bonding step S6 becomes slow. Therefore, this example can suppress the occurrence of deformation resulting from the friction between the side surface of the ceramic layer 11 and the side surface jig 71 due to drastic displacement.

In other words, this example can reduce the occurrence of the damage portion itself and can further reliably prevent the occurrence of de-lamination and cracks.

This example can provide a function and effect similar to that of Example 1.

EXAMPLE 5

This example uses, as such, the production steps of Example 1 but changes the disassembling method of the jig after the heat-bonding step S6 is carried out.

To remove the pressure on the ceramic laminate body 1 after the processing of the heat-bonding step S6 is substantially completed in this example, the pressure from the end face jig 72 is kept as such but the side surface jig 71 is first separated so as to release the side surface side of the ceramic laminate body 1. The pressure from the end face jig 72 is then removed.

Consequently, even when the ceramic laminate body 1 undergoes displacement in the laminating direction when the pressure from the end face jig 72 is removed, the frictional force is not imparted to the side surface of the ceramic layer 11. In other words, deformation due to the friction between the side surface of the ceramic layer 11 and the side surface jig can be prevented.

Therefore, this example can suppress the occurrence of the damage portion itself and can further reliably prevent the occurrence of de-lamination and cracks.

This example can provide a function and effect similar to that of Example 1.

This invention is not particularly limited to Examples 1 to 5 given above, but changes to the sequence of the production steps of each example and the addition of other steps can be made. For example, it is possible to cut or fragment the ceramic laminate body and then to conduct the side surface grinding step. It is further possible to conduct the step of cutting or fragmenting the ceramic laminate body before or after the degreasing and sintering steps.

As described above, it is further possible to directly laminate the ceramic layers to the final number of lamination without disposing the units in the intermediate step.

EXAMPLE 6

Figure 18:
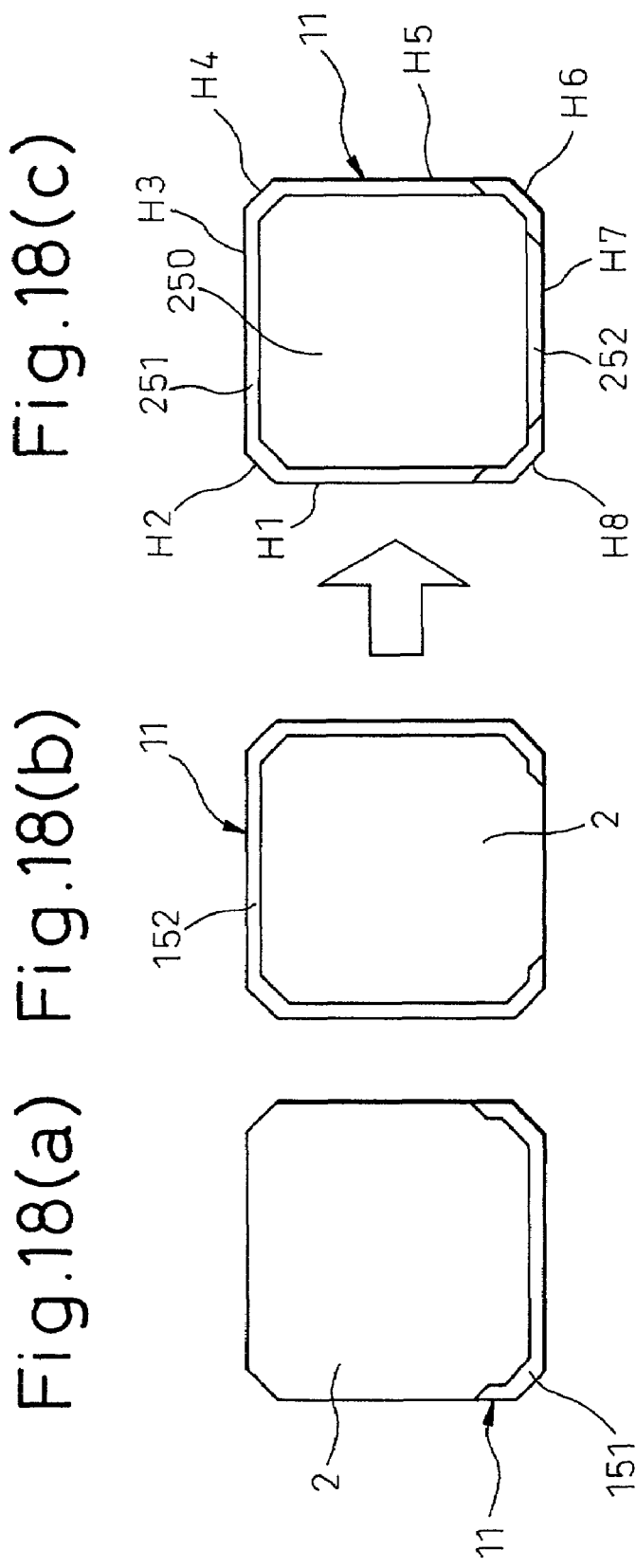
FIGS. 18(a) to 18(c) are explanatory views showing an electrode pattern in Example 6.
Figure 19:
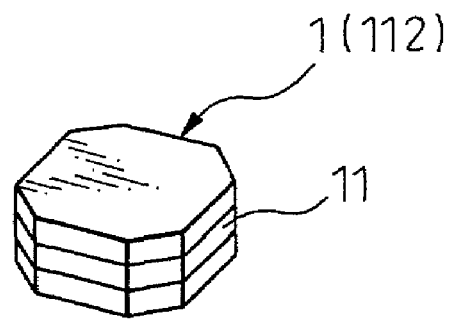
FIG. 19 is an explanatory view showing a ceramic laminate body comprising one unit.

This example represents an example where the ceramic laminate body 1 comprising only one unit 112 is produced as shown in FIG. 19. In this example, too, the ceramic layer 11 is formed of piezoelectric ceramic, and the resulting ceramic laminate body 1 is constituted by alternately laminating the ceramic layers 11 and the internal electrode layers 2 (FIGS. 18(*a*) to 18(*c*)). The number of laminations of the ceramic layers 11 is at least 2.

To produce this ceramic laminate body 1, this example uses a production method including a later-appearing heat-bonding step S204, a cutting step S205 and a side surface grinding step S208 as shown in FIG. 13.

Figure 15:
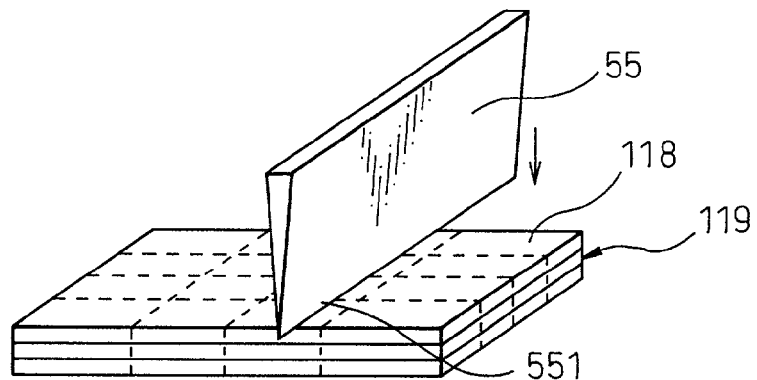
FIG. 15 is an explanatory view showing a cutting step in Example 6.

The heat-bonding step S204 is the one that heats a plurality of ceramic sheets while they are being laminated, and presses them in the laminating direction so as to form a heat-bonded broad intermediate laminate body 119. The cutting step 205 is the one that pushes a cutting edge 55 having an edge of an acute angle from one of the surfaces of the broad intermediate laminate body 119 and cuts the laminate body 119 to form the units as shown in FIG. 15. The side surface grinding step S208 is the step that grinds or cuts the side surface of each unit inclusive of the cut surface formed by the cutting step.

The explanation will be given in further detail.

In this example, a sheet forming step S201 of forming an elongated ceramic sheet as the basis of the ceramic layer 11 and a sheet punching step S202 of punching the elongated ceramic sheet to obtain ceramic sheets 110 having a predetermined size are first carried out.

Though the sheet forming step S201 can use various methods such as a doctor blade method, an extrusion molding method and so forth, this example employs the doctor blade method in the same way as in Example 1 to produce an elongated ceramic sheet wound into a roll. The starting material is adjusted so that a desired piezoelectric ceramic can be obtained after sintering. Concretely, this example uses PZT (lead zircotitanate) though various materials can be used.

In the sheet punching step S220, a ceramic sheet 110 capable of providing a large number of ceramic layers 11 is cut out from the elongated ceramic sheet.

Next, the internal electrode printing step S203 is carried out as shown in FIGS. 13 and 14(*a*). In this step, the internal electrode layer 2 is pattern-printed on each ceramic sheet 110. The printing position of the internal electrode layer 2 is set so that the later-appearing reserve portions 151 and 152 (FIGS. 18(*a*) to 18(*c*)) are finally formed on the ceramic layer 11.

The heat-bonding step S204 is then carried out as shown in FIGS. 13, 14(*b*) and 14(*c*). In this heat-bonding step S204, ten ceramic sheets 110 having the internal electrode layer 2 printed thereon are laminated and heat-bonded to give a broad intermediate laminate body 119. Incidentally, FIGS. 14(*a*) to 14(*d*) depict the ceramic laminate body while simplifying the number of lamination. The heat-bonding condition is a heating temperature of 120° C. and a pressure of 15 MPa. Jigs press from above and below the laminate body for 3 minutes.

As also shown in FIGS. 18(*a*) to 18(*d*), the ceramic sheets 110 are laminated in such a manner that the reserve portions 151 and 152 each not having the internal electrode 2 are so arranged as to deviate from one another.

Next, the cutting step S205 is carried out as shown in FIGS. 13, 14(*d*) and 15. The cutting step S205 uses a cutting edge 55 to cut the broad intermediate laminate body 119 including ten ceramic sheets 110 laminated one upon another.

The cutting edge 55 has an edge 551 having an acute angle, and its thickness progressively becomes greater away from the edge. Cutting is done while the cutting edge 55 is pushed from one of the surfaces of the broad intermediate laminate body 19.

Consequently, the unit 112 is fragmented extremely efficiently.

As shown in FIGS. 16(*a*) and 16(*b*), each of the units 112 so obtained substantially has a trapezoidal shape when it is viewed from the side. In other words, the cut surface 113 of the side surface is compressed along the shape of the cutting edge 55, and the compression amount is greater towards the upper part of the drawing. Therefore, damage having a higher density remains at portions where the compression amount is greater or in other words, the damage portion resulting from cutting remains in the proximity of the cut surface 113.

Next, in this embodiment, the degreasing step S206 and the sintering step S207 are carried out as shown in FIG. 13. As a result, the shrinkage ratio is different depending on the difference of the density on the cut surface 113 on the entire periphery of the side surface of the unit 112, and deformation occurs.

To reliably remove the portions where deformation, etc, is likely to occur due to the influences of the damage portion resulting from cutting, the side surface grinding step S208 is carried out to cut the portions in the proximity of the side surface portion 113 as shown in FIG. 17.

As shown in FIG. 17, the grinding range extends throughout the entire periphery of the region A of the unit 12 that is to finally remain. The shape when viewed from the side changes from the trapezoidal shape to a substantial rectangular shape. The shape of the remaining region A is substantially an octagon devoid of the corners of the square.

This example uses one unit 112 to form the ceramic laminate body 1. Therefore, the ceramic laminate body 1 so obtained is an octagonal pyramid having a relatively small thickness as shown in FIG. 19.

In this example, the side surface grinding step S208 is carried out in such a manner that at least a portion having a width B of 50 μm or more is removed on the upper surface 118 to which the cutting edge 55 is first pushed as shown in FIGS. 15 and 17. Consequently, the damage portion at the time of cutting can be reliably removed.

The internal lamination condition of the ceramic laminate body 1 is such that the internal electrode layers 2 so arranged as to have the reserve portions 151 and 152 having different shapes and the ceramic layers 11 are laminated one upon another as shown in FIGS. 18(a) to 18(c). As shown in these drawings, the shape of one of the reserve portions 151 is disposed on only the outer peripheral side of one major side and two minor sides encompassing the former. The shape of the other reserve portion 152 is disposed on the outer peripheral side of seven sides other than one major side.

Finally, the regions 251 of the internal electrode layer keeping contact with the sides H1 to H5 in FIG. 18(c) and the region 252 of the internal electrode layer keeping contact with the side H7 alternately exist, and the internal electrode layer 2 always exists in each octagonal region 250. Accordingly, when a pair of side surface electrodes is disposed, one of the side electrodes is disposed at a position keeping contact with any of the regions 251 and the other side electrode is disposed at a position keeping contact with the region 252.

Next, the function and effect of this example will be explained.

As described above, this example employs the cutting step S205 of cutting by using the cutting edge 55 in the production process. Therefore, the unit 112 can be fragmented extremely efficiently.

The damage portion resulting from cutting by using the cutting edge 55 can be removed in the side surface grinding step S208. Therefore, this example can provide a ceramic laminate body free from defects such as de-lamination and cracks resulting from the influence of the damage portion caused by cutting.

In this example, the side surface grinding step S208 is conducted after the sintering step S207. However, the side surface grinding step S208 can be carried out immediately after the cutting step S205.

Figure 20:
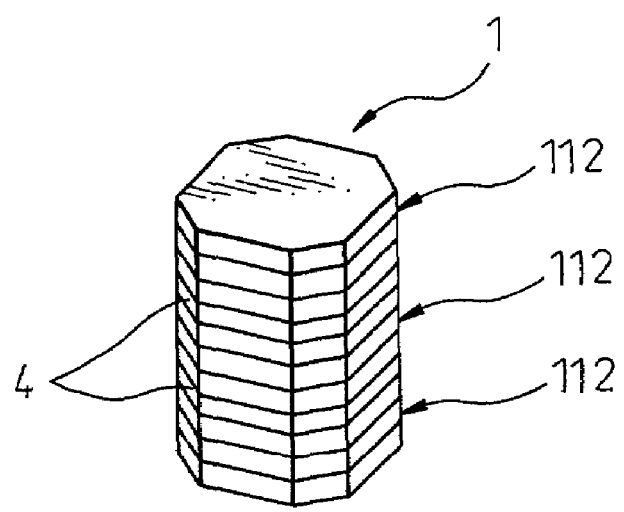
FIG. 20 is an explanatory view showing a ceramic laminate body of another example formed by bonding a plurality of units in Example 6.

In this example, one unit 112 constitutes the ceramic laminate body 1 as shown in FIG. 19. However, a ceramic laminate body 1 having a relatively large height can be obtained by conducting a bonding step that bonds a plurality of units 112, through adhesive layers 4, after the side surface grinding step S208 as shown in FIG. 20.

What is claimed is:

1. A method of producing a ceramic laminate body by laminating a plurality of ceramic layers, comprising:
   a heat-bonding step of covering a full periphery of side surfaces of said ceramic layers positioned in an orthogonal direction to a laminating direction with a side surface jig while said ceramic layers are laminated, heating said ceramic layers and pressing said ceramic layers from both end faces positioned in said laminating direction by end face jigs to form a heat-bonded ceramic laminate body; and
   removing the pressure from said side surface jig by separating said side surface jig from said ceramic laminate body before the pressure from said end face jigs is removed when the pressure from said side surface jig and from said end face jigs to said ceramic laminate body is removed.

2. A method of producing a ceramic laminate body according to claim 1, wherein said ceramic laminate body is a piezoelectric device used for an injector, and an aspect ratio A/B with A representing a size in said laminating direction and B representing a width is at least 2.

* * * * *